(12) United States Patent
Kijima et al.

(10) Patent No.: US 10,854,806 B2
(45) Date of Patent: Dec. 1, 2020

(54) VIBRATING DEVICE

(71) Applicant: TDK CORPORATION, Tokyo (JP)

(72) Inventors: Kaoru Kijima, Tokyo (JP); Tatsuya Taki, Tokyo (JP); Kazushi Tachimoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 399 days.

(21) Appl. No.: 15/894,169

(22) Filed: Feb. 12, 2018

(65) Prior Publication Data

US 2018/0233652 A1 Aug. 16, 2018

(30) Foreign Application Priority Data

Feb. 13, 2017 (JP) ................. 2017-024314

(51) Int. Cl.
| | |
|---|---|
| *H01L 41/047* | (2006.01) |
| *H01L 41/09* | (2006.01) |
| *H01L 41/187* | (2006.01) |
| *H01L 41/083* | (2006.01) |

(52) U.S. Cl.
CPC ...... *H01L 41/0475* (2013.01); *H01L 41/0474* (2013.01); *H01L 41/0477* (2013.01); *H01L 41/083* (2013.01); *H01L 41/09* (2013.01); *H01L 41/187* (2013.01)

(58) Field of Classification Search
CPC ............. H01L 41/0475; H01L 41/0474; H01L 41/0477; H01L 41/083; H01L 41/09; H01L 41/187
USPC .......................................... 310/311–371, 800
See application file for complete search history.

(56) References Cited

U.S. PATENT DOCUMENTS

| | | | |
|---|---|---|---|
| 2008/0100674 A1* | 5/2008 | Azumi | ................. B41J 2/14274 347/68 |
| 2012/0223986 A1* | 9/2012 | Yamada | ................... B41J 11/06 347/10 |
| 2012/0274688 A1* | 11/2012 | Okada | ..................... B41J 29/38 347/10 |

(Continued)

FOREIGN PATENT DOCUMENTS

| | | |
|---|---|---|
| JP | H04-70100 A | 3/1992 |
| JP | H10-315485 A | 12/1998 |

(Continued)

*Primary Examiner* — Thomas M Dougherty
(74) *Attorney, Agent, or Firm* — Oliff PLC

(57) ABSTRACT

A vibrating device includes a piezoelectric element, a wiring board electrically connected with the piezoelectric element, and a diaphragm including a metal. The piezoelectric element and the wiring board are bonded to the diaphragm. The piezoelectric element includes a piezoelectric element body, a plurality of internal electrodes, and a plurality of external electrodes. The piezoelectric element body has a first principal plane and a second principal plane opposed to each other. The plurality of internal electrodes is disposed in the piezoelectric element body. The internal electrodes are opposed to each other in a direction in which the first principal plane and the second principal plane are opposed. The plurality of external electrodes is disposed on the first principal plane, and is electrically connected with corresponding internal electrodes, of the plurality of internal electrodes. The wiring board has a resin film and a plurality of conductors.

7 Claims, 6 Drawing Sheets

(56) References Cited

U.S. PATENT DOCUMENTS

| | | | |
|---|---|---|---|
| 2018/0233653 A1* | 8/2018 | Kijima | H01L 41/0471 |
| 2020/0101735 A1* | 4/2020 | Okazawa | B41J 2/1433 |

FOREIGN PATENT DOCUMENTS

| | | |
|---|---|---|
| JP | 2006-150808 A | 6/2006 |
| JP | 2016-051895 A | 4/2016 |

* cited by examiner

VIBRATING DEVICE

TECHNICAL FIELD

One aspect of the present invention relates to a vibrating device.

BACKGROUND

Known vibrating devices include a piezoelectric element and a diaphragm made of glass and bonded to the piezoelectric element (for example, Japanese Unexamined Patent Publication No. 04-070100).

SUMMARY

In the vibrating device described in Japanese Unexamined Patent Publication No. 04-070100, the diaphragm is made of glass. Therefore, the Q value and the strength of the diaphragm are relatively low, and improvement of the displacement amount is difficult.

One aspect of the present invention is to provide a vibrating device with an improved displacement amount.

A vibrating device according to one aspect of the present invention includes a piezoelectric element, a wiring board electrically connected with the piezoelectric element, and a diaphragm including a metal. The piezoelectric element and the wiring board are bonded to the diaphragm. The piezoelectric element includes a piezoelectric element body, a plurality of internal electrodes, and a plurality of external electrodes. The piezoelectric element body includes a piezoelectric material, and has a first principal plane and a second principal plane opposed to each other. The plurality of internal electrodes is disposed in the piezoelectric element body. The internal electrodes are opposed to each other in a direction in which the first principal plane and the second principal plane are opposed. The plurality of external electrodes is disposed on the first principal plane, and is electrically connected with corresponding internal electrodes, of the plurality of internal electrodes. The wiring board has a resin film and a plurality of conductors. The resin film is bonded to the diaphragm. The plurality of conductors is disposed on the resin film, and is electrically connected with corresponding external electrodes, of the plurality of external electrodes. The plurality of external electrodes is separated from all of edges of the first principal plane as viewed from the direction. Conductors electrically connected with the plurality of internal electrodes are not disposed on the second principal plane of the piezoelectric element body. The second principal plane and the diaphragm are bonded.

In the vibrating device according to the one aspect of the present invention, the diaphragm includes a metal. The diaphragm including a metal has a higher Q value and strength than a diaphragm made of glass. Therefore, a displacement amount of the vibrating device is improved.

In the one aspect of the present invention, the plurality of external electrodes is disposed on the first principal plane, not on the second principal plane bonded to the diaphragm. Conductors electrically connected with the plurality of internal electrodes are not disposed on the second principal plane. The plurality of external electrodes is separated from all of edges of the first principal plane as viewed from the direction. As a result, even when the diaphragm includes a metal, the piezoelectric element (external electrode) and the diaphragm are electrically insulated. Therefore, a short circuit between the piezoelectric element and the diaphragm is less likely to occur, and electrical reliability of the vibrating device is improved.

The piezoelectric element body may further have side surface adjacent to the first principal plane and the second principal plane. The plurality of internal electrodes may not be exposed to the side surface. In this case, the piezoelectric element and the diaphragm are more reliably electrically insulated.

The plurality of external electrodes may be separated from all of edges of the plurality of internal electrodes as viewed from the direction. In this case, the plurality of external electrodes is further separated from the edges of the first principal plane as viewed from the direction. As a result, the external electrodes and the diaphragm are more reliably electrically insulated.

The plurality of internal electrodes may include a first internal electrode and a second internal electrode. In this case, the plurality of external electrodes may include a plurality of first external electrodes and a plurality of second external electrodes. The plurality of first external electrodes may be electrically connected with the first internal electrode, and adjacent to each other on the first principal plane. The plurality of second external electrodes may be electrically connected with the second internal electrode, and adjacent to each other on the first principal plane. In this case, electrical connection reliability between the piezoelectric element and the wiring board is improved.

The first principal plane may have a rectangular shape as viewed from the direction. In this case, the plurality of first external electrodes and the plurality of second external electrodes may be disposed along only one side of the edges of the first principal plane. In this case, electrical connection between the plurality of first external electrodes and the wiring board is easily realized and electrical connection between the plurality of second external electrodes, and the wiring board is easily realized.

The vibrating device according to the one aspect of the present invention may further include a first conductive resin and a second conductive resin. The first conductive resin may have one end portion connected with the plurality of first external electrodes and another end portion connected with corresponding conductors, of the plurality of conductors. The second conductive resin may have one end portion connected with the plurality of second external electrodes and another end portion connected with corresponding conductors, of the plurality of conductors. In this case, electrical connection between the plurality of first external electrodes and the conductors corresponding to the plurality of first external electrodes is easily realized. Further, electrical connection between the plurality of second external electrodes and the conductors corresponding to the plurality of second external electrodes is easily realized.

The side surface of the piezoelectric element body may be bonded to the diaphragm. In this case, bonding strength between the piezoelectric element and the diaphragm is improved. As a result, displacement of the piezoelectric element is efficiently transmitted to the diaphragm.

DETAILED DESCRIPTION

Hereinafter, embodiments will be described in detail with reference to the accompanying drawings. Note that, in the description, the same reference sign is used for the same elements or elements having the same function, and redundant description is omitted.

Figure 1:
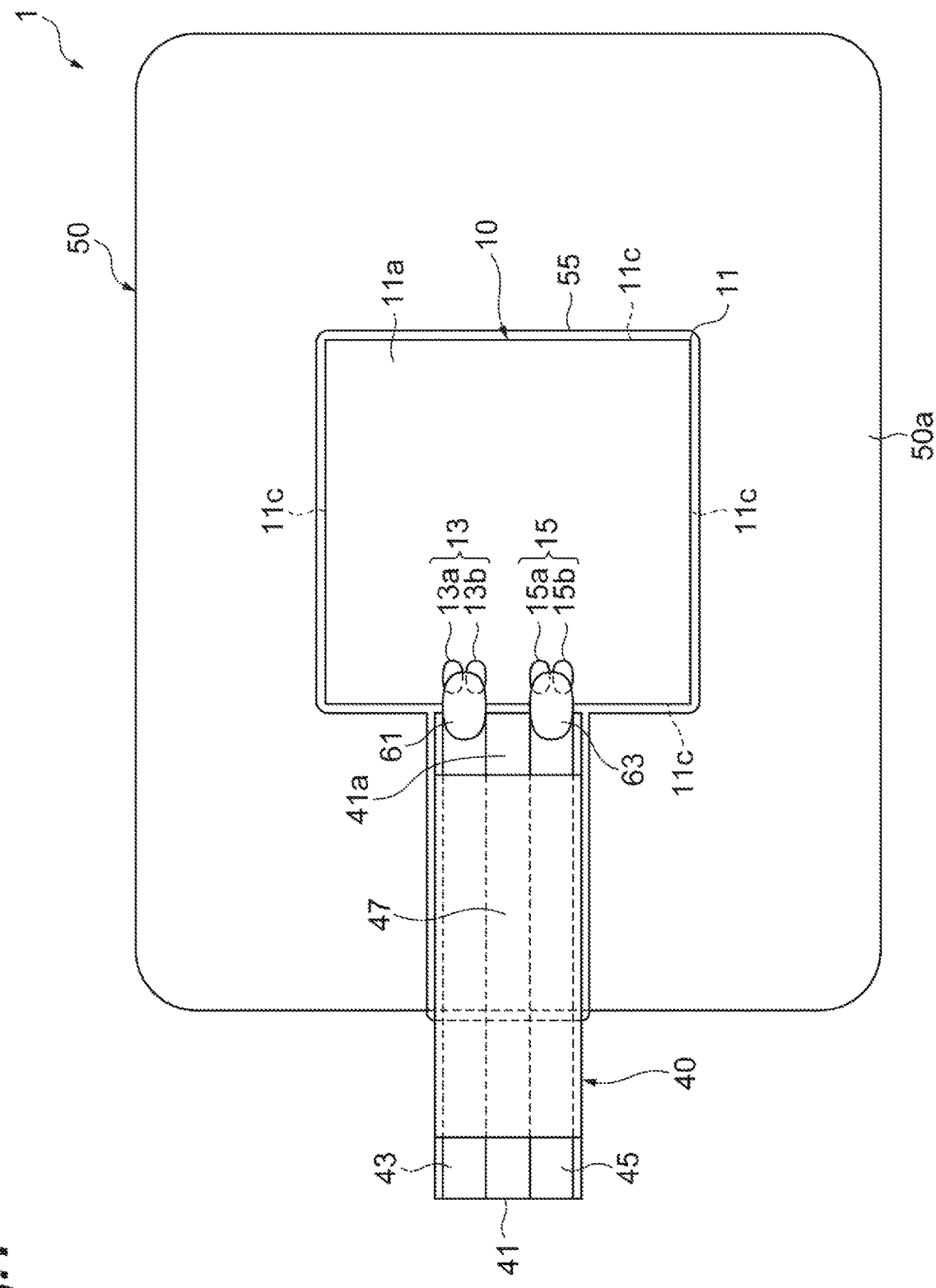
FIG. 1 is a plan view of a vibrating device according to an embodiment.
Figure 2:
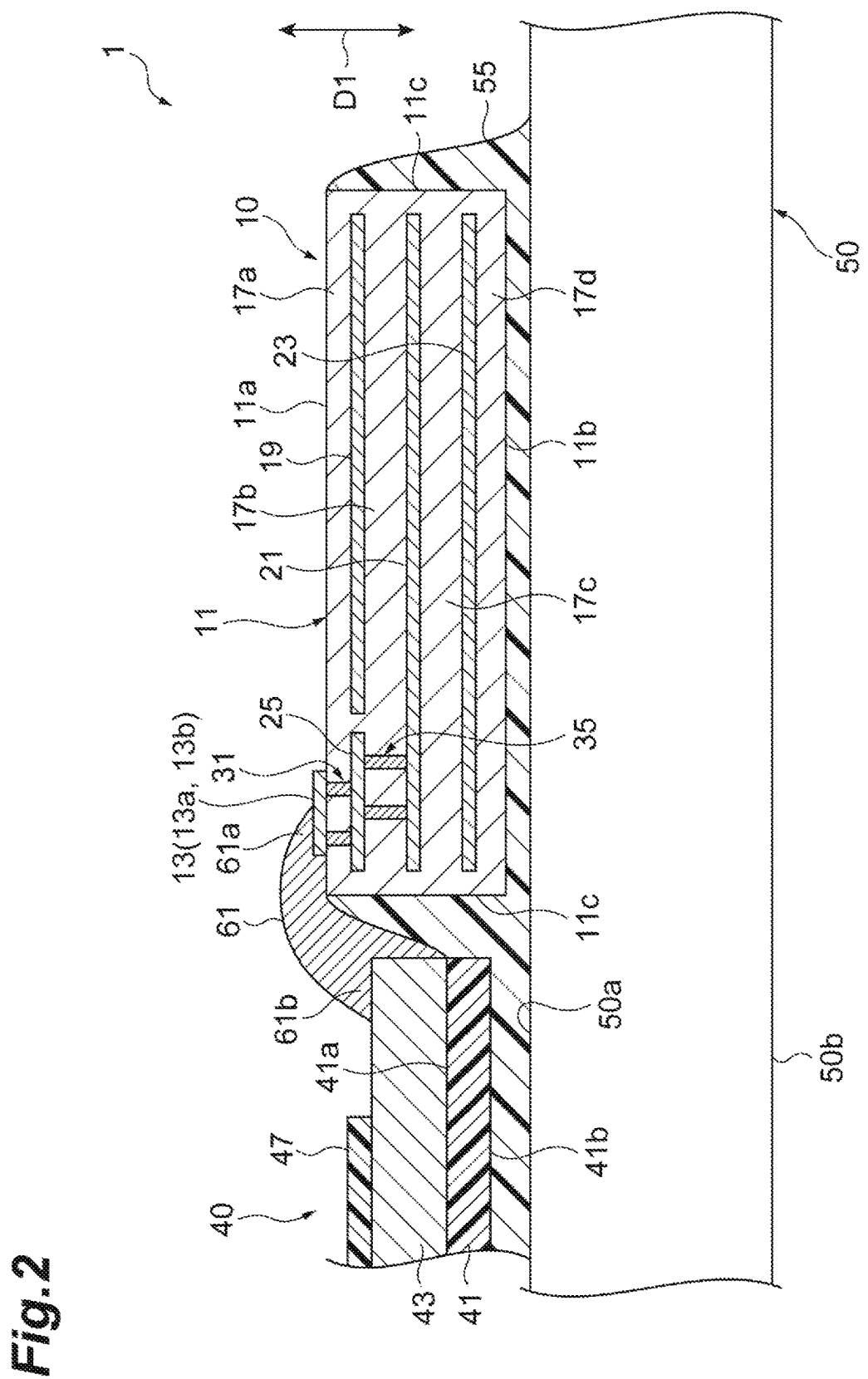
FIG. 2 is a diagram illustrating a sectional configuration of the vibrating device according to the present embodiment.
Figure 3:
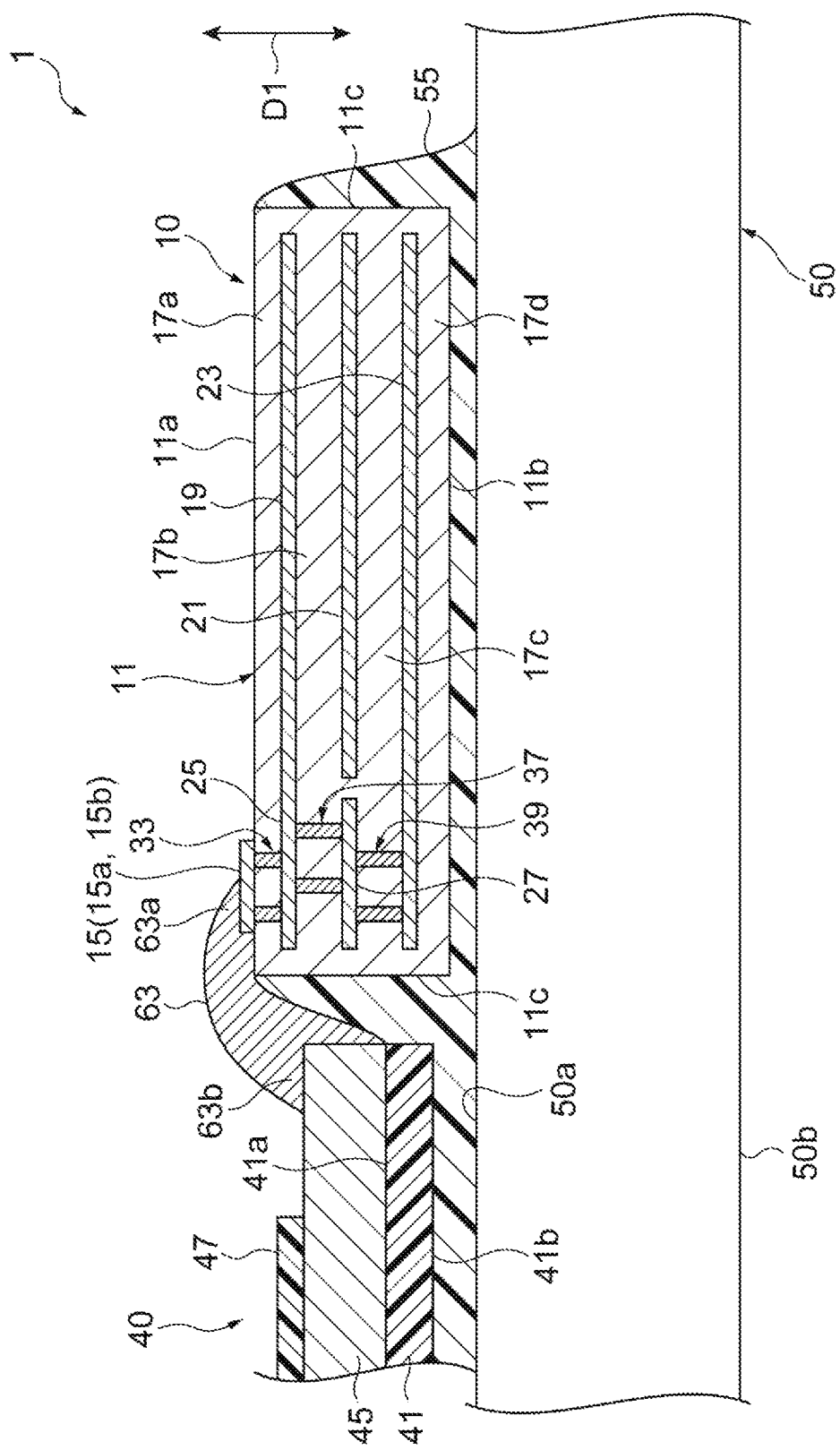
FIG. 3 is a diagram illustrating a sectional configuration of the vibrating device according to the present embodiment.
Figure 4:
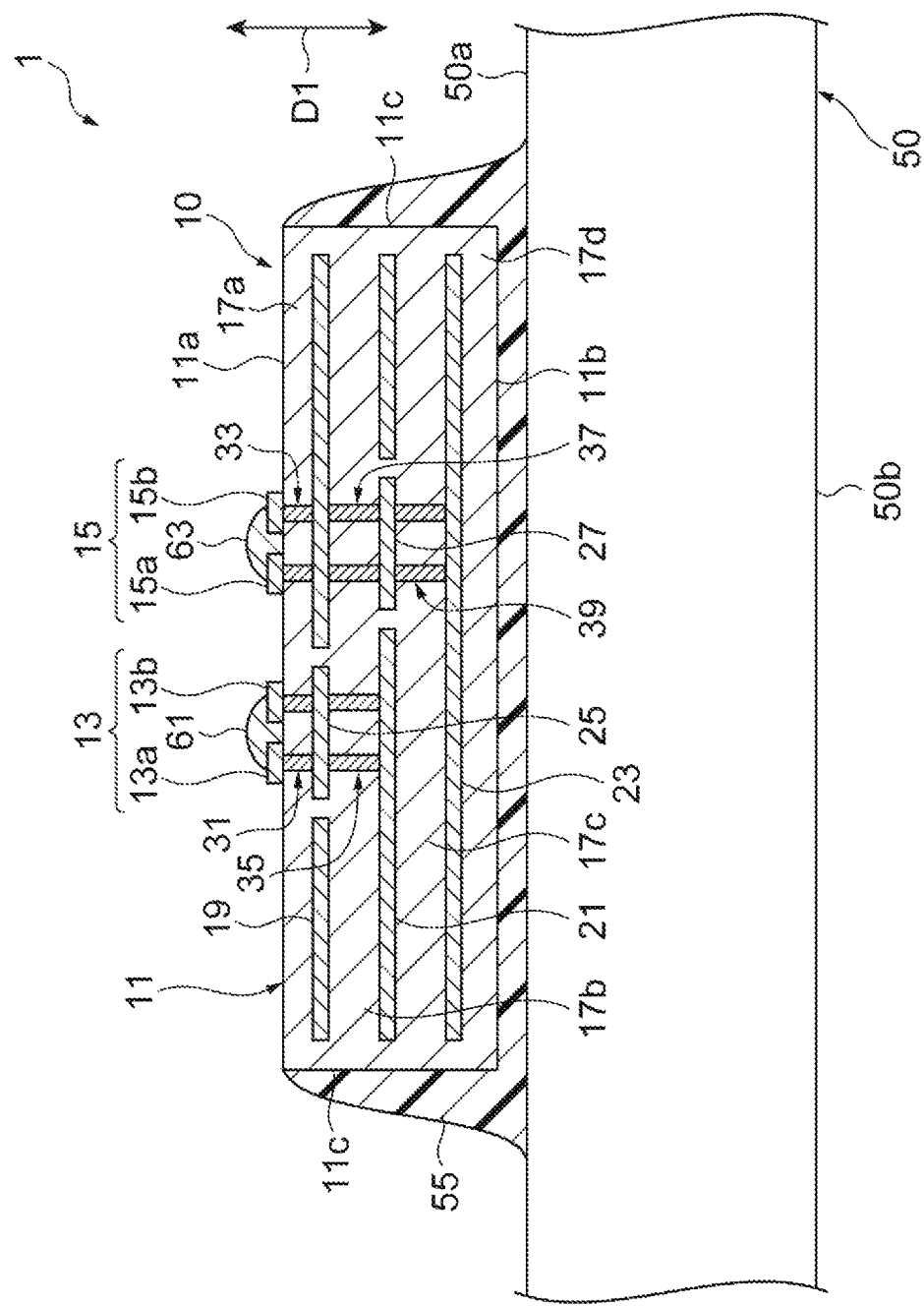
FIG. 4 is a diagram illustrating a sectional configuration of the vibrating device according to the present embodiment.
Figure 5:
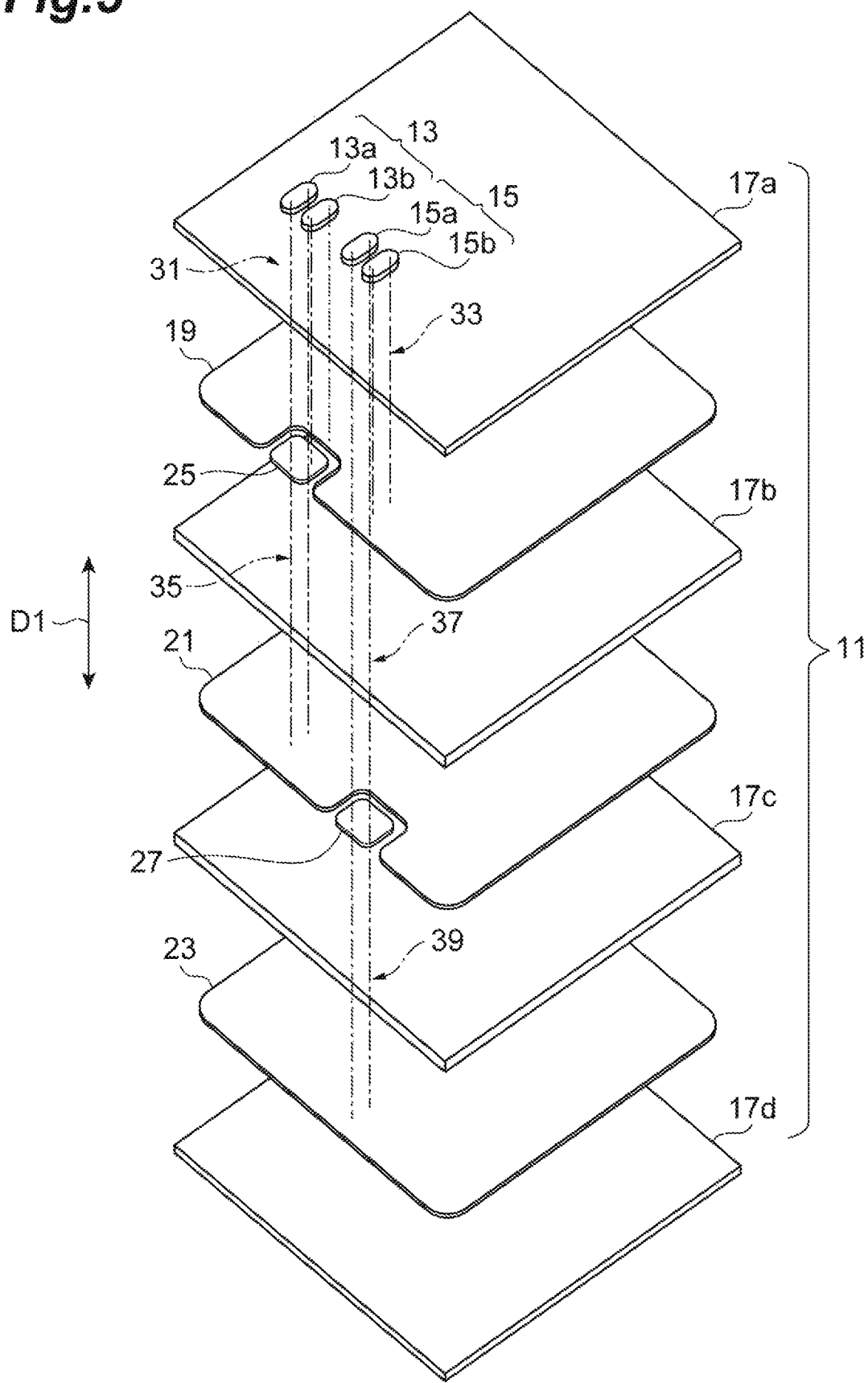
FIG. 5 is an exploded perspective view illustrating a configuration of a piezoelectric element.
Figure 6:
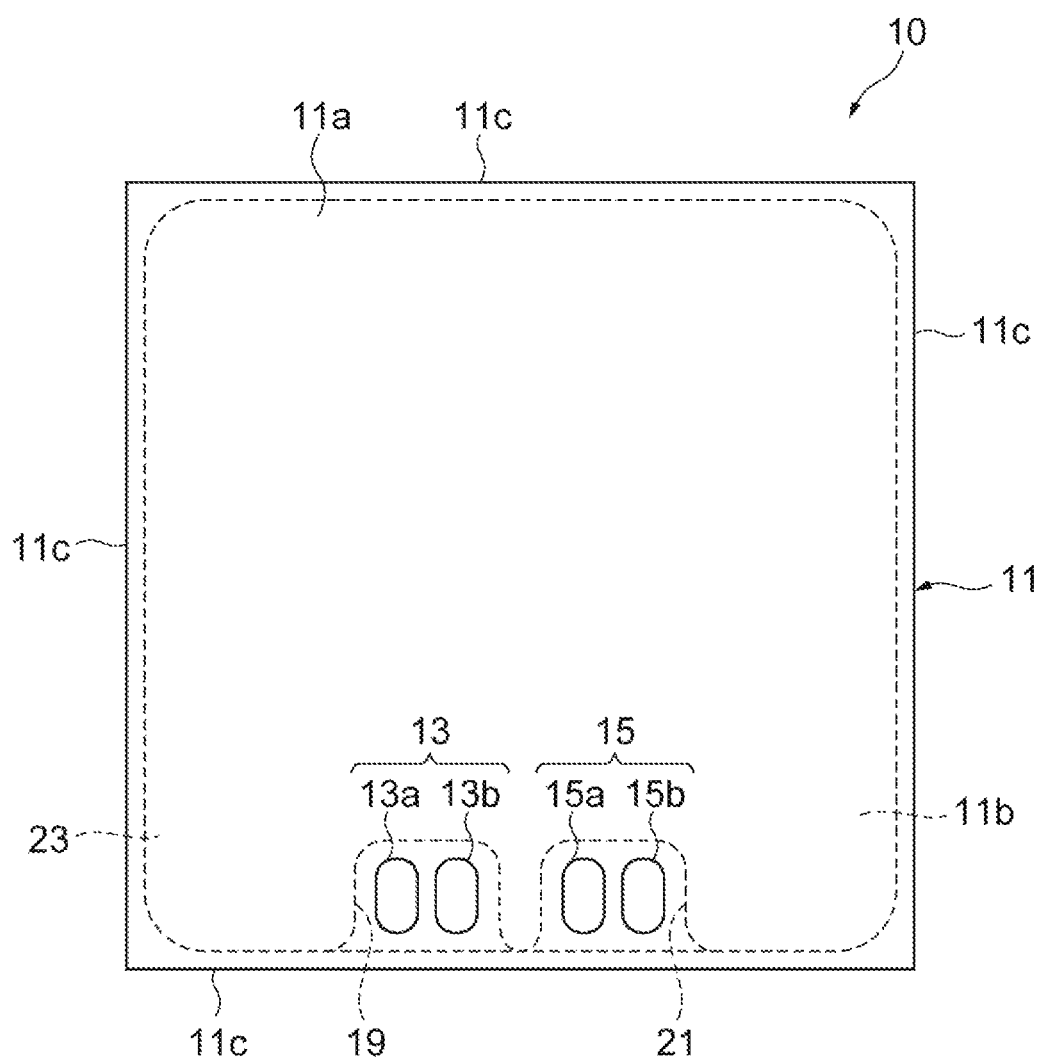
FIG. 6 is a plan view of the piezoelectric element.

A configuration of a vibrating device 1 according to the present embodiment will be described with reference to FIGS. 1 to 6. FIG. 1 is a plan view of a vibrating device according to an embodiment. FIGS. 2, 3, and 4 are diagrams illustrating a sectional configuration of the vibrating device according to the present embodiment. FIG. 5 is an exploded perspective view illustrating a configuration of a piezoelectric element. FIG. 6 is a plan view of the piezoelectric element.

As illustrated in FIG. 1, the vibrating device 1 includes a piezoelectric element 10, a wiring board 40, and a diaphragm 50. The piezoelectric element 10 includes a piezoelectric element body 11 and a plurality of external electrodes 13 and 15.

The piezoelectric element body 11 has a rectangular parallelepiped shape. The piezoelectric element body 11 has a pair of principal planes 11a and 11b opposed to each other and four side surfaces 11c. The rectangular parallelepiped shape includes a rectangular parallelepiped shape with chamfered corner portions and ridge portions, and a rectangular parallelepiped shape with rounded corner portions and ridge portions. The principal planes 11a and 11b have a rectangular shape. In the present embodiment, the principal planes 11a and 11b have a square shape.

The direction in which the pair of principal planes 11a and 11b are opposed is a first direction D1. The first direction D1 is also a direction orthogonal to the principal planes 11a and 11b. The four side surfaces 11c extend in the first direction D1 in such a way as to connect the pair of principal planes 11a and 11b. The principal planes 11a and 11b and the side surfaces 11c are indirectly adjacent via a ridge line portion. The length of the piezoelectric element body 11 in the first direction D1 (the thickness of the piezoelectric element body 11) is, for example, 100 μm.

As illustrated in FIG. 5, the piezoelectric element body 11 includes a plurality of piezoelectric layers 17a, 17b, 17c, and 17d laminated in the first direction D1. In the present embodiment, the piezoelectric element body 11 includes the four piezoelectric layers 17a, 17b, 17c, and 17d. In the piezoelectric element body 11, the direction in which the plurality of piezoelectric layers 17a, 17b, 17c, and 17d is laminated accords with the first direction D1.

Each of the piezoelectric layers 17a, 17b, 17c, and 17d contains a piezoelectric material. In the present embodiment, each of the piezoelectric layers 17a, 17b, 17c, and 17d contains a piezoelectric ceramic material. Examples of the piezoelectric ceramic material include PZT[Pb (Zr, Ti)O$_3$], PT(PbTiO$_3$), PLZT[(Pb, La)(Zr, Ti)O$_3$], and barium titanate (BaTiO$_3$). Each of the piezoelectric layers 17a, 17b, 17c, and 17d is composed of a sintered body of a ceramic green sheet containing the above-described piezoelectric ceramic material, for example. In the actual piezoelectric element body 11, the piezoelectric layers 17a, 17b, 17c, and 17d are integrated to such an extent that boundaries between each two of the piezoelectric layers 17a, 17b, 17c, and 17d cannot be recognized.

The piezoelectric layer 17a has the principal plane 11a. The piezoelectric layer 17d has the principal plane 11b. The piezoelectric layers 17b and 17c are located between the piezoelectric layer 17a and the piezoelectric layer 17d. The thickness of the piezoelectric layer 17a or 17d is smaller than the thickness of the piezoelectric layer 17b or 17c. The thickness of the piezoelectric layer 17a or 17d is, for example, 33 μm. The thickness of the piezoelectric layer 17b or 17c is, for example, 16 μm.

As illustrated in FIGS. 2, 3, 4, and 5, the piezoelectric element 10 includes a plurality of internal electrodes 19, 21, and 23 disposed in the piezoelectric element body 11. In the present embodiment, the piezoelectric element 10 includes the three internal electrodes 19, 21, and 23.

Each of the internal electrodes 19, 21, and 23 contain a conductive material. As the conductive material, Ag, Pd, or an Ag—Pd alloy is used, for example. Each of the internal electrodes 19, 21, and 23 is composed as a sintered body of a conductive paste containing the above-described conductive material. Each of the internal electrodes 19, 21, and 23 has an approximately rectangular shape (for example, approximately square shape).

The internal electrodes 19, 21, and 23 are disposed at different positions (layers) in the first direction D1. The internal electrode 19 and the internal electrode 21 are opposed to each other with a space in the first direction D1. The internal electrode 21 and the internal electrode 23 are opposed to each other with a space in the first direction D1. The internal electrode 19 is located between the piezoelectric layer 17a and the piezoelectric layer 17b. The internal electrode 21 is located between the piezoelectric layer 17b and the piezoelectric layer 17c. The internal electrode 23 is located between the piezoelectric layer 17c and the piezoelectric layer 17d.

The internal electrodes 19, 21, and 23 are not exposed to a surface of the piezoelectric element body 11. That is, the internal electrodes 19, 21, and 23 are not exposed to the side surface 11c. Therefore, as illustrated in FIG. 6, each of the internal electrodes 19, 21, and 23 is separated from all of edges (four sides) of the principal plane 11a or 11b as viewed from the first direction D1.

The plurality of external electrodes 13 and 15 is disposed on the principal plane 11a. The external electrode 13 includes a plurality of external electrodes 13a and 13b. In the present embodiment, the external electrode 13 includes the two external electrodes 13a and 13b. The external electrode 15 includes a plurality of external electrodes 15a and 15b. In the present embodiment, the external electrode 15 includes the two external electrodes 15a and 15b. Each of the external electrodes 13a, 13b, 15a, and 15b has an approximately elliptical shape as viewed from the first direction D1.

Each of the external electrode 13 and 15 (each of the external electrodes 13a, 13b, 15a, and 15b) contains a conductive material. As the conductive material, Ag, Pd, or an Ag—Pd alloy is used, for example. Each of the external electrodes 13 and 15 is composed as a sintered body of a conductive paste containing the above conductive material.

As illustrated in FIG. 6, each of the external electrodes 13 and 15 (each of the external electrodes 13a, 13b, 15a, and 15b) is separated from all of edges (four sides) of the principal plane 11a or 11b as viewed from the first direction D1. As illustrated in FIG. 6, each of the external electrodes 13 and 15 (each of the external electrodes 13a, 13b, 15a, and 15b) is separated from all of edges (four sides) of the internal electrode 19, 21, or 23 as viewed from the first direction D1.

The external electrode 13a and the external electrode 13b are adjacent to each other. The external electrode 15a and the external electrode 15b are adjacent to each other. The four external electrodes 13a, 13b, 15a, and 15b are disposed along only one side of the principal plane 11a. The external electrode 13b and the external electrode 15a are adjacent to each other.

The external electrodes 13a and 13b are electrically connected with a connection conductor 25 through a plurality of via conductors 31, respectively. The connection conductor 25 is located in the same layer as the internal electrode 19. The connection conductor 25 is located between the piezoelectric layer 17a and the piezoelectric layer 17b. The internal electrode 19 and the connection conductor 25 are separated from each other. The connection conductor 25 is opposed to the external electrodes 13a and 13b in the first direction D1. The plurality of via conductors 31 is connected with the external electrodes 13a and 13b and the connection conductor 25.

The external electrodes 15a and 15b are electrically connected with the internal electrode 19 through a plurality of via conductors 33, respectively. The internal electrode 19 is opposed to the external electrodes 15a and 15b in the first direction D1. The plurality of via conductors 33 is connected with the external electrodes 15a and 15b and the internal electrode 19.

The connection conductor 25 is electrically connected with the internal electrode 21 through a plurality of via conductors 35. The connection conductor 25 is opposed to the internal electrode 21 in the first direction D1. The plurality of via conductors 35 is connected with the connection conductor 25 and the internal electrode 21.

The internal electrode 19 is electrically connected with a connection conductor 27 through a plurality of via conductors 37. The connection conductor 27 is located in the same layer as the internal electrode 21. The connection conductor 27 is located between the piezoelectric layer 17b and the piezoelectric layer 17c. The internal electrode 21 and the connection conductor 27 are separated from each other. The connection conductor 27 is opposed to the internal electrode 19 in the first direction D1. The plurality of via conductors 37 is connected with the internal electrode 19 and the connection conductor 27.

The connection conductor 27 is electrically connected with the internal electrode 23 through a plurality of via conductors 39. The connection conductor 27 is opposed to the internal electrode 23 in the first direction D1. The plurality of via conductors 39 is connected with the connection conductor 27 and the internal electrode 23.

The external electrodes 13a and 13b are electrically connected with the internal electrode 21 through the plurality of via conductors 31, the connection conductor 25, and the plurality of via conductors 35. The external electrodes 15a and 15b are electrically connected with the internal electrode 19 through the plurality of via conductors 33. The external electrodes 15a and 15b are electrically connected with the internal electrode 23 through the plurality of via conductors 33, the internal electrode 19, the plurality of via conductors 37, the connection conductor 27, and the plurality of via conductors 39.

Each of the connection conductors 25 and 27 and the via conductors 31, 33, 35, 37, and 39 contain a conductive material. As the conductive material, Ag, Pd, or an Ag—Pd alloy is used, for example. Each of the connection conductors 25 and 27 and the via conductors 31, 33, 35, 37, and 39 is composed as a sintered body of a conductive paste containing the above conductive material. Each of the connection conductors 25 and 27 has an approximately rectangular shape. The via conductors 31, 33, 35, 37, and 39 are formed by sintering the conductive paste filled in throughholes fouiied in the ceramic green sheets for forming the corresponding piezoelectric layers 17a, 17b, and 17c.

Conductors electrically connected with the internal electrodes 19 and 23 and conductors electrically connected with the internal electrode 21 are not disposed on the principal plane 11b of the piezoelectric element body 11. In the present embodiment, when the principal plane 11b is viewed from the first direction D1, the entire principal plane 11b is exposed. The principal planes 11a and 11b are natural surfaces. The natural surface is a plane constituted by a surface of crystal grains grown by firing.

Conductors electrically connected with the internal electrodes 19 and 23 and conductors electrically connected with the internal electrode 21 are also not disposed on each of the side surfaces 11c of the piezoelectric element body 11. In the present embodiment, when each of the side surfaces 11c is viewed from a direction orthogonal to the side surface 11c, the entire side face 11c is exposed. In the present embodiment, the side surfaces 11c are also natural surfaces.

The wiring board 40 has a resin film 41, a plurality of conductors 43 and 45, and a coating film 47. In the present embodiment, the wiring board 40 is provided with the pair of conductors 43 and 45. The wiring board 40 is, for example, a flexible printed circuit board (FPC).

The resin film 41 has a pair of principal planes 41a and 41b opposed to each other. The resin film 41 has electrical insulation properties. In the present embodiment, the principal plane 41b is entirely exposed when the principal plane 41b is viewed from a direction in which the principal plane 41a and the principal plane 41b are opposed to each other. The resin film 41 contains, for example, a polyimide resin.

The pair of conductors 43 and 45 is disposed on the resin film 41 (principal plane 41a). The conductor 43 and the conductor 45 extend in a predetermined direction. The conductor 43 and the conductor 45 are separated from each other in a direction intersecting with a direction in which the conductors 43 and 45 extend. Each of the conductors 43 and 45 contains, for example, copper.

The coating film 47 is disposed on the conductors 43 and 45 in such a way as to cover a part of the conductors 43 and 45. Both ends of the conductors 43 and 45 in the direction in which the conductors 43 and 45 extend are exposed from the coating film 47. The coating film 47 is also disposed on the principal plane 41a in such a way as to cover a region exposed from the conductors 43 and 45 on the principal plane 41a. Both end portions of the resin film 41 in the direction in which the conductors 43 and 45 extend are also exposed from the coating film 47. The coating film 47 is in contact with the conductors 43 and 45 and is in contact with the resin film 41 (principal plane 41a). The resin film 41 and the coating film 47 are bonded to each other in a region where the resin film 41 and the coating film 47 are in contact with each other. The coating film 47 contains, for example, a polyimide resin. For example, gold flash plating is applied to the both ends of the conductors 43 and 45 exposed from the coating film 47.

The length of the wiring board 40 (the thickness of the wiring board 40) in the direction in which the principal planes 41a and 41b are opposed to each other is defined with a total of the length of the resin film 41 (the thickness of the resin film 41) in this direction, the length of the conductors 43 and 45 (the thickness of the conductors 43 and 45) in this direction, and the length of the coating film 47 (the thickness of the coating film 47) in this direction. In the present embodiment, the thickness of the wiring board 40 is, for example, 70 µm.

The diaphragm 50 includes a metal and has principal planes 50a and 50b opposed to each other. The diaphragm 50 contains, for example, a Ni—Fe alloy, Ni, brass, or stainless steel. The diaphragm 50 (the principal faces 50a and 50b) has a rectangular shape as viewed from a direction in which the principal plane 50a and the principal plane 50b are opposed. The length of the diaphragm 50 (the thickness of the diaphragm 50) in the direction in which the principal plane 50a and the principal plane 50b are opposed is, for example, 250 µm.

The piezoelectric element 10 and the wiring board 40 are bonded to the diaphragm 50. The principal plane 11b of the piezoelectric element body 11 and the principal plane 50a of the diaphragm 50 are opposed to each other. The principal plane 41b of the resin film 41 and the principal plane 50a of the diaphragm 50 are opposed to each other. That is, the principal plane 11b and the principal plane 50a are bonded to each other. The principal plane 41b and the principal plane 50a are bonded to each other.

In a state where the piezoelectric element 10 and the wiring board 40 are bonded to the diaphragm 50, the first direction D1, the direction in which the principal plane 41a and the principal plane 41b are opposed, the direction in which the principal plane 50a and the principal plane 50b are opposed are approximately the same. The piezoelectric element 10 is disposed in a central portion of the diaphragm 50 as viewed from the first direction D1.

For example, a resin (epoxy resin, acrylic resin, or the like) is used as a member (sometimes simply referred to as "bonding member") 55 for bonding the piezoelectric element 10 and the wiring board 40 to the diaphragm 50. The bonding member 55 does not contain a conductive filler and has electrical insulation properties.

The four side surfaces 11c of the piezoelectric element body 11 are also bonded to the diaphragm 50 (principal plane 50a). In the present embodiment, the principal plane 41b and the four side surfaces 11c of the piezoelectric element body 11 are entirely covered with the bonding member 55.

The space between the principal plane 11b and the principal plane 50a (the thickness of the bonding member 55 located between the principal plane 11b and the principal plane 50a) is, for example, 7 µm. The space between the principal plane 41b and the principal plane 50a (the thickness of the bonding member 55 located between the principal plane 41b and the principal plane 50a) is, for example, 10 to 30 µm. The thickness of the bonding member 55 located between the principal plane 41b and the principal plane 50a is larger than the thickness of the bonding member 55 located between the principal plane 11b and the principal plane 50a.

The piezoelectric element 10 and the wiring board 40 are adjacent to each other on the diaphragm 50. The wiring board 40 is adjacent to the one side of the principal plane 11a along which the four external electrodes 13a, 13b, 15a, and 15b are disposed as viewed from the first direction D1. The piezoelectric element 10 and the wiring board 40 are separated from each other as viewed from the first direction D1. The space between the piezoelectric element 10 and the wiring board 40 is, for example, 1 mm.

The direction in which the conductors 43 and 45 extend and the one side along which the four external electrodes 13a, 13b, 15a, and 15b are disposed intersect with each other as viewed from the first direction D1. In the present embodiment, the direction in which the conductors 43 and 45 extend and the one side along which the four external electrodes 13a, 13b, 15a, and 15b are disposed are approximately orthogonal to each other.

As illustrated in FIGS. 1 to 3, the vibrating device 1 includes a connecting member 61 that electrically connects the external electrodes 13a and 13b and the conductor 43, and a connecting member 63 that electrically connects the external electrodes 15a and 15b and the conductor 45.

The connecting member 61 has one end portion 61a connected with the plurality of external electrodes 13a and 13b and another end portion 61b connected with the conductor 43. The other end portion 61b of the connecting member 61 is connected with one end portion of the conductor 43, the one end portion being exposed from the coating film 47. The conductor 43 is electrically connected with the internal electrode 21 through the connecting member 61, the external electrodes 13a and 13b (external electrode 13), the plurality of via conductors 31, the connection conductor 25, and the plurality of via conductors 35.

The connecting member 63 has one end portion 63a connected with the plurality of external electrodes 15a and 15b and another end portion 63b connected with the conductor 45. The other end portion 63b of the connecting member 63 is connected with one end portion of the conductor 45, the one end portion being exposed from the coating film 47. The conductor 45 is electrically connected with the internal electrode 19 through the connecting member 63, the external electrodes 15a and 15b (external electrode 15), and the plurality of via conductors 33. The conductor 45 is further electrically connected with the internal electrode 23 through the plurality of via conductors 37, the connection conductor 27, and the plurality of via conductors 39.

The connecting members 61 and 63 contain a conductive resin. The conductive resin layer contains a resin (for example, a thermosetting resin) and a conductive material (for example, a metal powder). As the metal powder, for example, Ag powder is used. As the thermosetting resin, a phenol resin, an acrylic resin, a silicone resin, an epoxy resin, or a polyimide resin is used, for example. The hardness of the connecting members 61 and 63 is smaller than the hardness of the bonding member 55.

The connecting member 61 is disposed on the bonding member 55 in such a way as to be in contact with the external electrodes 13a and 13b and one end portion of the conductor 43. The connecting member 63 is disposed on the bonding member 55 in such a way as to be in contact with the external electrodes 15a and 15b and one end portion of the conductor 45. The connecting members 61 and 63 are in contact with the bonding member 55.

When voltages having different polarities are applied to the external electrodes 13 (13a and 13b) and the external electrodes 15 (15a and 15b) through the conductors 43 and 45, an electric field occurs between the internal electrode 21 and the internal electrodes 19 and 23. A region in the piezoelectric layer 17b, the region being sandwiched between the internal electrode 19 and the internal electrode 21, and a region in the piezoelectric layer 17c, the region being sandwiched between the internal electrode 21 and the internal electrode 23 serve as active regions, and displacement occurs in the active regions. When an AC voltage is applied to the external electrodes 13 and 15, the piezoelectric element 10 repeats expansion and contraction in accordance with the frequency of the applied AC voltage. Since the piezoelectric element 10 and the diaphragm 50 are bonded to each other, the diaphragm 50 performs flexural vibration integrally with the piezoelectric element 10 in accordance with the repetition of expansion and contraction in the piezoelectric element 10.

As described above, in the present embodiment, the diaphragm 50 includes a metal. The diaphragm 50 including a metal has a higher Q value and strength than a diaphragm made of glass. Therefore, the displacement amount of the vibrating device 1 is improved.

The piezoelectric element 10 is disposed in the central portion of the diaphragm 50 as viewed in the first direction D1. Therefore, in the vibrating device 1, the displacement of the piezoelectric element 10 is efficiently transmitted to the diaphragm 50.

The external electrodes 13 and 15 (13a, 13b, 15a, and 15b) are disposed not on the principal plane 11b but on the principal plane 11a. The principal plane 11b is bonded to the diaphragm 50. Conductors electrically connected with the internal electrodes 19, 21, and 23 are not disposed on the principal plane 11b. The external electrodes 13 and 15 (13a, 13b, 15a, and 15b) are separated from all the edges of the principal plane 11a as viewed from the first direction D1. As a result, even when the diaphragm 50 includes a metal, the piezoelectric element 10 (external electrodes 13 and 15) and the diaphragm 50 are electrically insulated. Therefore, a short circuit between the piezoelectric element 10 and the diaphragm 50 is less likely to occur, and the electrical reliability of the vibrating device 1 is improved.

The piezoelectric element body 11 has the four side surfaces 11c, and the internal electrodes 19, 21, and 23 are not exposed to the side surfaces 11c. Therefore, in the vibrating device 1, the piezoelectric element 10 and the diaphragm 50 are further reliably electrically insulated.

The external electrodes 13a, 13b, 15a, and 15b are separated from all the edges of the internal electrodes 19, 21, and 23 as viewed from the first direction D1. Therefore, in the vibrating device 1, the external electrodes 13a, 13b, 15a, and 15b are further separated from the edge of the principal plane 11a as viewed from the first direction D1. As a result, the external electrodes 13a, 13b, 15a, and 15b and the diaphragm 50 are further reliably electrically insulated.

The two external electrodes 13a and 13b electrically connected with the internal electrode 21 are adjacent to each other on the principal plane 11a. The two external electrodes 13a and 13b are electrically connected with the conductor 43 through the connecting member 61. The two external electrodes 15a and 15b electrically connected with the internal electrodes 19 and 23 are also adjacent to each other on the principal plane 11a. The two external electrodes 15a and 15b are electrically connected with the conductor 45 through the connecting member 63. Therefore, in the vibrating device 1, the electrical connection reliability between the piezoelectric element 10 and the wiring board 40 is improved.

Each of the principal planes 11a and 11b has a rectangular shape as viewed from the first direction D1. The four external electrodes 13a, 13b, 15a, and 15b are disposed along only one side of the edge of the principal plane 11a. Therefore, in the vibrating device 1, electrical connection between the four external electrodes 13a, 13b, 15a, and 15b and the wiring board 40 (conductors 43 and 45) is easily realized.

The two external electrodes 13a and 13b are electrically connected with the conductor 43 through the connecting member 61. The two external electrodes 15a and 15b are electrically connected with the conductor 45 through the connecting member 63. Therefore, in the vibrating device 1, electrical connection between the two external electrodes 13a and 13b and the conductor 43 is easily realized. Electrical connection between the two external electrodes 15a and 15b and the conductor 45 is easily realized.

The side surfaces 11c of the piezoelectric element body 11 are bonded to the diaphragm 50. Therefore, in the vibrating device 1, the bonding strength between the piezoelectric element 10 and the diaphragm 50 is improved. Therefore, the displacement of the piezoelectric element 10 is efficiently transmitted to the diaphragm 50.

The member (bonding member) 55 that bonds the piezoelectric element 10 and the diaphragm 50 does not contain a conductive filler. Therefore, in the bonding member 55, the resin component contained in the same volume is larger and the adhesive strength is higher than those of a bonding member containing the conductive filler. Therefore, in the vibrating device 1, the bonding strength between the diaphragm 50 and the piezoelectric element 10 is increased.

No member other than the bonding member 55 exists between the piezoelectric element 10 and the diaphragm 50. Therefore, the displacement of the piezoelectric element 10 is more efficiently transmitted by the diaphragm 50.

The piezoelectric element 10 is electrically connected with the wiring board 40 disposed on the diaphragm 50 on which the piezoelectric element 10 is disposed. Therefore, a difference in height between the external electrodes 13 and 15 (13a, 13b, 15a, and 15b) and the conductors 43 and 45 in the first direction D1 is smaller than that in the following vibrating device for comparison. Therefore, in the vibrating device 1, a mechanical load acting on the connecting members 61 and 63 is low. As a result, reduction in electrical connection reliability between the external electrodes 13 and 15 and the conductors 43 and 45 via the connecting members 61 and 63 is suppressed. In the vibrating device for comparison, external electrodes 13 and 15 and a conductor formed on a diaphragm 50 through an insulating thin film are electrically connected via a conductive resin.

The piezoelectric element 10 and the wiring board 40 are separated as viewed from the first direction D1. Therefore, in the vibrating device 1, shape change of the connecting members 61 and 63 is gentle as compared with the vibrating device in which the piezoelectric element 10 and the wiring board 40 are in contact with each other. Therefore, the mechanical load acting on the connecting members 61 and 63 is lower.

The connecting members 61 and 63 are disposed on the member 55 that bonds the piezoelectric element 10 and the diaphragm 50. Therefore, in the vibrating device 1, the connecting members 61 and 63 are easily formed.

The hardness of the connecting members 61 and 63 is smaller than the hardness of the member 55 that bonds the piezoelectric element 10 and the diaphragm 50. Therefore, in the vibrating device 1, the connecting members 61 and 63 are easily deformed in accordance with the displacement of the piezoelectric element 10, as compared with the vibrating device in which the hardness of the connecting members 61 and 63 is equal to or more than the hardness of the member 55 that bonds the piezoelectric element 10 and the diaphragm 50. As a result, reduction in electrical connection reliability between the external electrodes 13 and 15 and the conductors 43 and 45 via the connecting members 61 and 63 is suppressed.

The embodiments of the present invention have been described. The present invention is not necessarily limited to the above-described embodiments, and various modifications can be made without departing from the gist thereof.

The number of the internal electrodes, the number of the piezoelectric layers 17a, 17b, 17c, and 17d, and the number of the external electrodes 13 and 15 (13a, 13b, 15a, and 15b) included in the piezoelectric element 10 are not limited to the numbers disclosed in the above-described embodiment.

The member 55 that bonds the piezoelectric element 10 and the diaphragm 50 and the member 55 that bonds the wiring board 40 and the diaphragm 50 may be the same member or different members.

The diaphragm 50 may be a casing of an electronic device or the like. The diaphragm 50 may be a separate member from the casing of an electronic device or the like. In this case, the diaphragm 50 may be attached to the causing by surface bonding.

What is claimed is:

1. A vibrating device comprising:
    a piezoelectric element;
    a wiring board electrically connected with the piezoelectric element; and
    a diaphragm including a metal and to which the piezoelectric element and the wiring board are bonded, wherein
    the piezoelectric element includes
    a piezoelectric element body including a piezoelectric material and having a first principal plane and a second principal plane opposed to each other,
    a plurality of internal electrodes disposed in the piezoelectric element body, and opposed to each other in a direction in which the first principal plane and the second principal plane are opposed to each other, and
    a plurality of external electrodes disposed on the first principal plane, and electrically connected with corresponding internal electrodes, of the plurality of internal electrodes,
    the wiring board includes
    a resin film bonded to the diaphragm, and
    a plurality of conductors disposed on the resin film, and electrically connected with corresponding external electrodes, of the plurality of external electrodes,
    the plurality of external electrodes is separated from all of edges of the first principal plane as viewed from the direction, and
    conductors electrically connected with the plurality of internal electrodes are not disposed on the second principal plane of the piezoelectric element body, and
    the second principal plane and the diaphragm are bonded to each other.

2. The vibrating device according to claim 1, wherein
    the piezoelectric element body further includes a side surface adjacent to the first principal plane and the second principal plane, and
    the plurality of internal electrodes is not exposed to the side surface.

3. The vibrating device according to claim 1, wherein the plurality of external electrodes is separated from all of edges of the plurality of internal electrodes as viewed from the direction.

4. The vibrating device according to claim 1, wherein
    the plurality of internal electrodes includes a first internal electrode and a second internal electrode, and
    the plurality of external electrodes includes
    a plurality of first external electrodes electrically connected with the first internal electrode, and adjacent to each other on the first principal plane, and
    a plurality of second external electrodes electrically connected with the second internal electrode, and adjacent to each other on the first principal plane.

5. The vibrating device according to claim 4, wherein
    the first principal plane has a rectangular shape as viewed from the direction, and
    the plurality of first external electrodes and the plurality of second external electrodes are disposed along only one side of the edges of the first principal plane.

6. The vibrating device according to claim 4, further comprising:
    a first conductive resin having one end portion connected with the plurality of first external electrodes and another end portion connected with corresponding conductors, of the plurality of conductors; and
    a second conductive resin having one end portion connected with the plurality of second external electrodes and another end portion connected with corresponding conductors, of the plurality of conductors.

7. The vibrating device according to claim 2, wherein the side surface of the piezoelectric element body is bonded to the diaphragm.

* * * * *